(12) United States Patent
Inoue et al.

(10) Patent No.: US 7,629,729 B2
(45) Date of Patent: Dec. 8, 2009

(54) SURFACE ACOUSTIC WAVE DEVICE AND FABRICATION METHOD THEREOF

(75) Inventors: Kazunori Inoue, Kawasaki (JP); Takashi Matsuda, Kawasaki (JP); Jyouji Kimura, Yokohama (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 287 days.

(21) Appl. No.: 11/541,787

(22) Filed: Oct. 3, 2006

(65) Prior Publication Data

US 2007/0075606 A1 Apr. 5, 2007

(30) Foreign Application Priority Data

Oct. 4, 2005 (JP) .............................. 2005-290969

(51) Int. Cl.
*H01L 41/08* (2006.01)
(52) U.S. Cl. .................. 310/348; 310/313 R; 310/340; 310/344
(58) Field of Classification Search ............... 310/340, 310/344, 348, 313
See application file for complete search history.

(56) References Cited

U.S. PATENT DOCUMENTS

| | | | |
|---|---|---|---|
| 6,057,222 A | 5/2000 | Pahl et al. | |
| 6,154,940 A | 12/2000 | Onishi et al. | |
| 6,628,043 B2 * | 9/2003 | Furukawa et al. | 310/313 R |
| 7,342,351 B2 * | 3/2008 | Kubo et al. | 310/344 |
| 2002/0043899 A1* | 4/2002 | Kishimoto | 310/348 |
| 2002/0100964 A1 | 8/2002 | Onishi et al. | |
| 2004/0145278 A1* | 7/2004 | Iwamoto | 310/348 |

FOREIGN PATENT DOCUMENTS

| | | |
|---|---|---|
| DE | 195 48 046 A1 | 6/1997 |
| EP | 0 939 485 A1 | 9/1999 |
| EP | 1 492 231 A1 | 12/2004 |
| JP | 3196693 B2 | 6/2001 |
| JP | 3225906 B2 | 8/2001 |
| JP | 3291046 B2 | 3/2002 |
| JP | 2003-523082 A | 7/2003 |
| JP | 2004-153412 A | 5/2004 |

* cited by examiner

*Primary Examiner*—Jaydi SanMartin
(74) *Attorney, Agent, or Firm*—Arent Fox LLP.

(57) ABSTRACT

A surface acoustic wave device includes a piezoelectric substrate, a surface acoustic wave element composed of electrodes provided on the piezoelectric substrate and the piezoelectric substrate, a first seal resin portion provided on the piezoelectric substrate and having a cavity on the surface acoustic wave element, and an inorganic insulation film provided in contact with a surface of the piezoelectric substrate to surround the surface acoustic wave element.

9 Claims, 11 Drawing Sheets

SURFACE ACOUSTIC WAVE DEVICE AND FABRICATION METHOD THEREOF

BACKGROUND OF THE INVENTION

1. Field of the Invention

This invention generally relates to surface acoustic wave devices and fabrication methods therefor, and more particularly, to a surface acoustic wave device having a seal resin portion with a cavity arranged in an upper portion of a surface acoustic wave element and a fabrication method therefor.

2. Description of the Related Art

Surface acoustic wave devices are for use in various circuits for signal processing in frequency range, for example, of 45 MHz to 2 GHz, such as transmit bandpass filters, receive bandpass filters, local oscillation filters, intermediate frequency filters, FM modulators, and the like. In recent years, the afore-mentioned signal processing devices have been increasingly small-sized, and there is a demand for reducing the sizes of electronic parts such as the surface acoustic wave devices used in the signal processing devices. In surface acoustic wave elements employed for the surface acoustic wave devices, comb-teeth electrodes (Interdigital Transducer: IDT) and reflectors are formed on a piezoelectric substrate with the use of metal films.

In portable electronics devices such as mobile telephones or the like, in particular, the electronic parts are increasingly used as a module. To this end, there is a need for the surface acoustic wave device that is low in height and that surface mount is available. At the same time, there is another need for providing a cavity on a top surface of electrode fingers of IDT, which are functional parts (oscillating part) of the surface acoustic wave device, so as to maintain the characteristics of the surface acoustic wave device. There is yet another need for ensuring hermetic sealing of the cavity to achieve the reliability of the surface acoustic wave element.

There has been proposed a method of forming a structure that includes a seal resin portion having a cavity in contact with the functional part of the surface acoustic wave element (namely, hollow structure), in order to satisfy the above-described needs. As disclosed in Japanese Patent No. 3,291,046 (conventional example 1), there is provided a method of forming a hollow structure by providing a melting resin in a region to be a cavity on the surface acoustic wave element, forming an upper plate on the melting resin, and removing the melting resin. As disclosed in Japanese Patent Application Publication No. 2003-523082 (conventional example 2), there is proposed a method of forming the hollow structure by forming a frame structure that surrounds an electronic structural element, applying an auxiliary film on the frame structure, providing a resin layer thereon, and removing portions other than a roof portion of the frame structure, so as to form a cavity on the electronic structural element. As disclosed in Japanese Patent No. 3,196,693 (conventional example 3), there is provided a method of forming the hollow structure by applying a resin film on a piezoelectric substrate on which multiple surface acoustic wave elements are formed, opening the resin film on the functional part of the substrate, and bonding the circuit board on the resin film. As disclosed in Japanese Patent No. 3,225,906 (conventional example 4), there is provided a method of forming the hollow structure by providing a light-sensitive resin on the substrate on which multiple surface acoustic wave elements are provided, opening the light-sensitive resin in an upper part of the functional part of the surface acoustic wave element, mounting an assembly of wirings and substrate, and separating by dicing. As disclosed in Japanese Patent Application Publication No. 2004-153412 (conventional example 5), there is provided a method of forming the hollow structure by forming a protection member that surrounds the surface acoustic wave element, and providing a protection film to cover the protection member and the functional part of the surface acoustic wave element.

In the hollow structures formed by the conventional examples 1 through 4, resins are provided on the piezoelectric substrate, demonstrating insufficient reliability. In the hollow structure formed by the conventional example 5, the protection film and the piezoelectric substrate are bonded by thermal compression or by adhesive, also demonstrating insufficient reliability.

SUMMARY OF THE INVENTION

The present invention has been made in view of the above circumstances and provides a surface acoustic wave device having a hollow structure in a seal resin portion in which the reliability can be improved and a fabrication method therefor.

According to one aspect of the present invention, there is provided a surface acoustic wave device including: a surface acoustic wave element composed of a piezoelectric substrate and electrodes provided thereon; a first seal resin portion provided on the piezoelectric substrate and having a cavity on the surface acoustic wave element; and an inorganic insulation film provided in contact with a surface of the piezoelectric substrate to surround the surface acoustic wave element. The bonding between the piezoelectric substrate and the inorganic insulation film is strong, and thereby improving the reliability.

According to another aspect of the present invention, there is provided a fabrication method of a surface acoustic wave device including: forming a surface acoustic wave element on a piezoelectric substrate; forming a first seal resin portion on the piezoelectric substrate to have a cavity on the surface acoustic wave element; and forming an inorganic insulation film on the first seal resin portion and on a surface of the piezoelectric substrate that surrounds the first seal resin portion.

BRIEF DESCRIPTION OF THE DRAWINGS

Preferred exemplary embodiments of the present invention will be described in detail with reference to the following drawings, wherein.

DESCRIPTION OF THE PREFERRED EMBODIMENTS

A description will now be given, with reference to the accompanying drawings, of exemplary embodiments of the present invention.

First Exemplary Embodiment

Figure 1A:
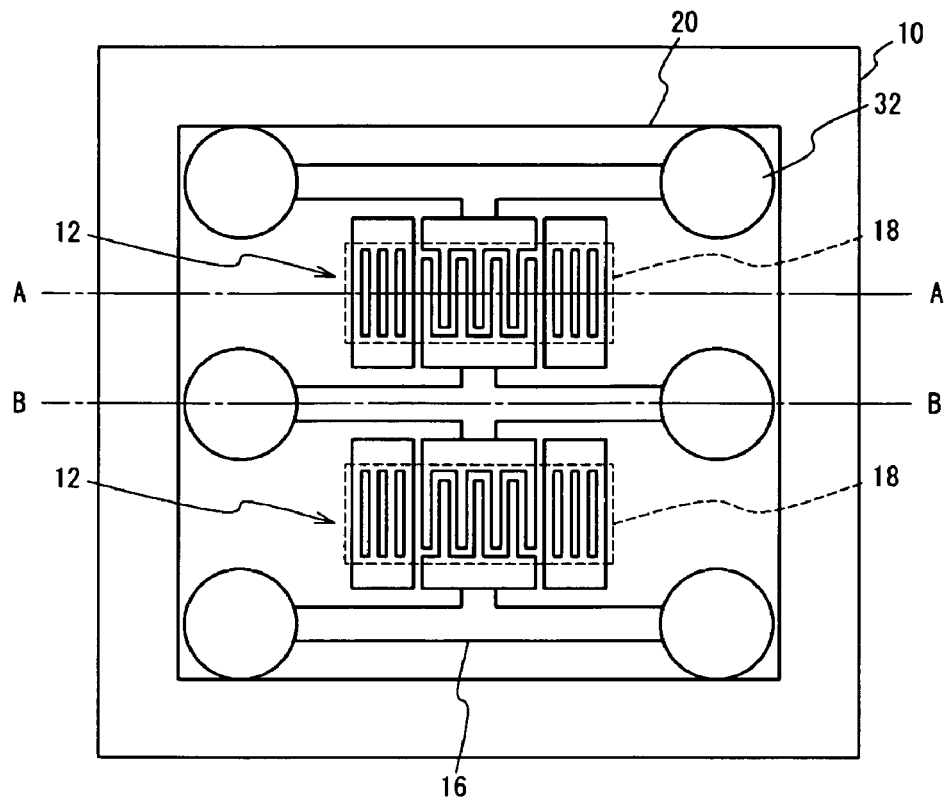
FIG. 1A is a plan view of a surface acoustic wave device of comparative example.
Figure 1B:
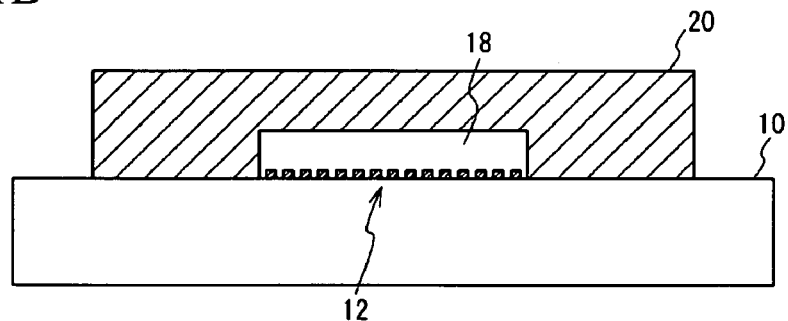
FIG. 1B is a cross-sectional view taken along the line A-A shown in FIG. 1A.
Figure 1C:
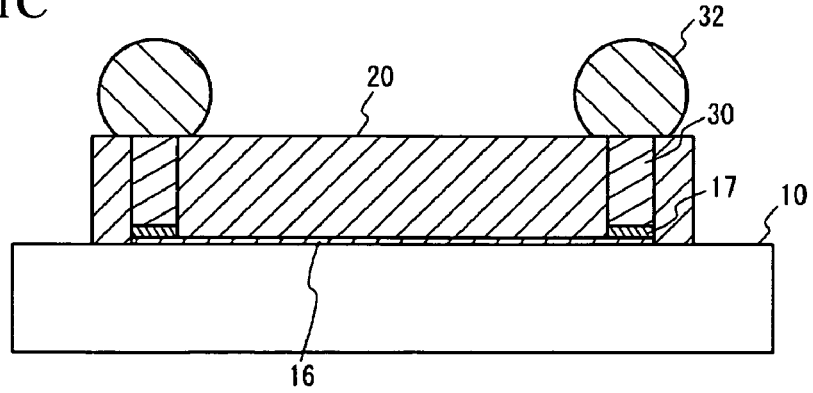
FIG. 1C is a cross-sectional view taken along the line B-B shown in FIG. 1A.

Firstly, a description will now be given of results of pressure cooker test (PCT), as a reliability test, of the surface acoustic wave device having a hollow structure in a seal resin portion (hereinafter, referred to as comparative example) in order to clarify the problems in the conventional examples 1 through 5. FIG. 1A through FIG. 1C illustrate the aforedescribed surface acoustic wave device on which PCT has been performed. FIG. 1A is a plan view of the surface acoustic wave device of the comparative example. FIG. 1B is a cross-sectional view taken along the line A-A shown in FIG. 1A. FIG. 1C is a cross-sectional view taken along the line B-B shown in FIG. 1A. Here, in FIG. 1A, there are shown surface acoustic wave elements 12, a wiring 16, and cavities 18, with a first seal resin portion 20 being transparent, and the surface acoustic wave elements 12 and the wiring 16 are represented by solid lines and the cavities 18 are represented by dotted lines. Referring to FIG. 1A and FIG. 1B, there are provided the surface acoustic wave elements 12 and the seal resin portion 20, the surface acoustic wave elements 12 being made up of: IDTs composed of metal films arranged on a piezoelectric substrate 10; electrodes such as reflectors and the like; and the piezoelectric substrate 10, the seal resin portion 20 having the cavities in the functional parts of the surface acoustic wave elements 12 on the piezoelectric substrate 10.

Referring to FIG. 1A and FIG. 1C, the wiring 16 is formed on the piezoelectric substrate 10, and the seal resin portion 20 is provided on the wiring 16. Plug metals 30 extend through the seal resin portion 20, and the surface acoustic wave elements 12 and the plug metals 30 are coupled by the wiring 16. Solder balls 32 are provided on the plug metals 30. In this manner, the surface acoustic wave elements 12 are sealed with the seal resin portion 20 having a hollow structure, being coupled through the wiring 16 and the plug metals 30 to the solder balls 32.

Figure 2A:
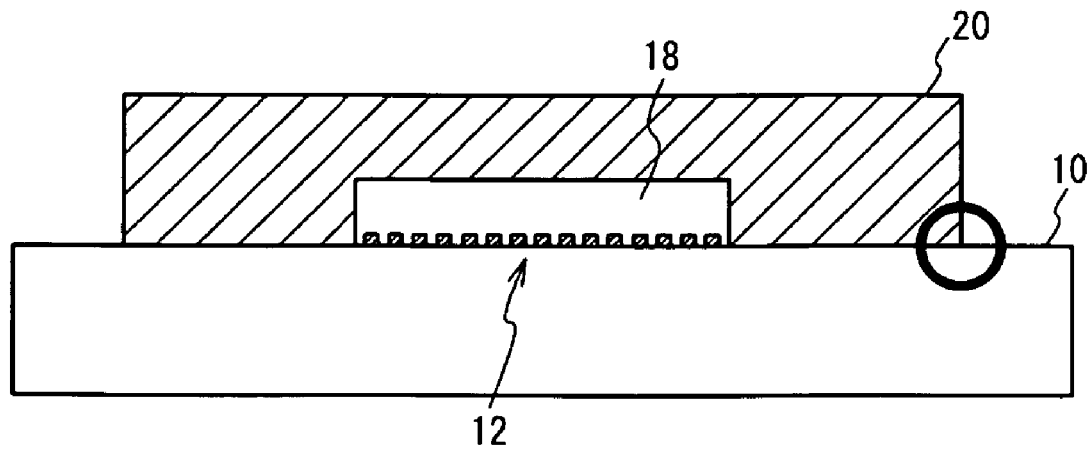
FIG. 2A and FIG. 2B illustrate a surface acoustic wave device of comparative example to explain the cause of peeled seal resin portion during pressure cooker test (PCT)
Figure 2B:
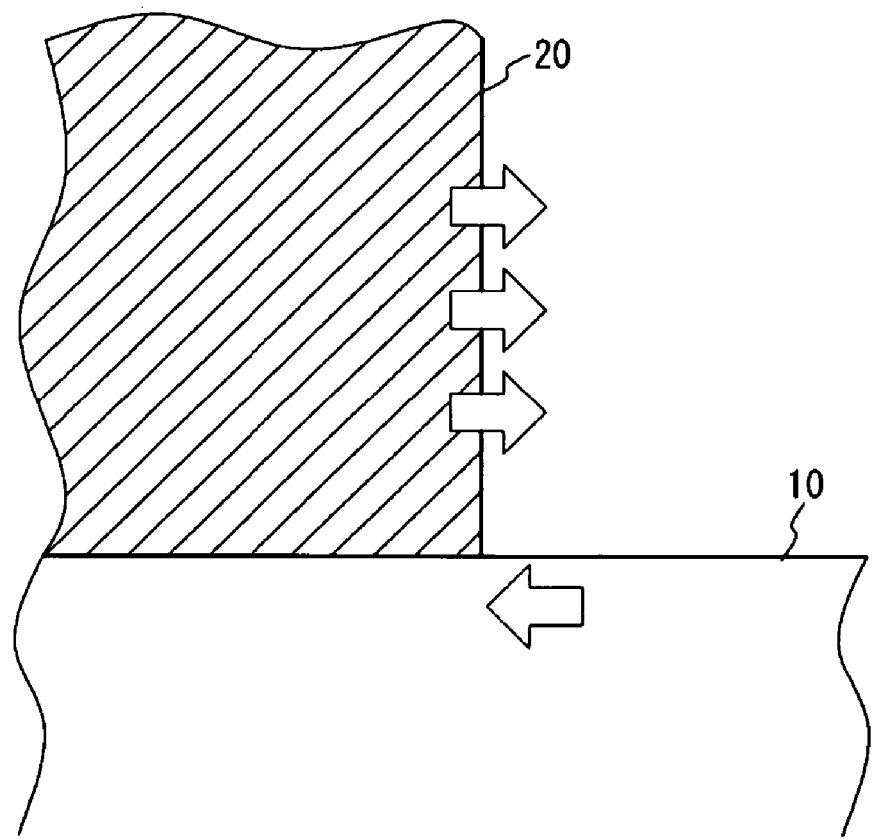

PCT has been performed on the surface acoustic wave device of the above-described comparative example at the temperature of 120° C., the humidity of 100% RH, 2 atmosphere of pressure, and the exposure time of 100 hours. The test has exhibited peeled seal resin portion 20. The inventors of the present invention have studied the cause of peeling and found out that the seal resin portion 20 having the hollow structure absorbed moisture during the test and the resin swelled. FIG. 2A and FIG. 2B explain the above-described cause. FIG. 2A corresponds to FIG. 1B. In FIG. 2A, the same components and configurations as those employed in FIG. 1B have the same reference numerals and a detailed explanation will be omitted. FIG. 2B is an enlarged view of the interface, represented as a circle in FIG. 2A, between the seal resin portion 20 and the piezoelectric substrate 10.

Referring to FIG. 2B, the seal resin portion 20 absorbs moisture and swells, and thereby a force is exerted as indicated by arrows pointing to a right-hand direction. A retentive force is exerted in the piezoelectric substrate 10 at the periphery of the interface between the piezoelectric substrate 10 and the seal resin portion 20, as indicated by an arrow pointing to a left-hand direction. When a stress greater than the adhesion between the piezoelectric substrate 10 and the seal resin portion 20 is applied between the piezoelectric substrate 10 and the seal resin portion 20, the seal resin portion 20 starts peeling. Then, the seal resin portion 20 absorbs much more moisture, the seal resin portion 20 further swells, and the seal resin portion 20 further peels. In this manner, the seal resin portion 20 peels. It is desirable that the region in which the piezoelectric substrate 10 and the seal resin portion 20 adhere to each other should be smaller to reduce the size of the device in which the seal resin portion 20 has a hollow structure. The seal resin portion 20, however, readily peels. As stated heretofore, in the structure in which the seal resin portion is directly in contact with the piezoelectric substrate as the conventional examples 1 through 4, the seal resin portion peels during PCT. A description will be given, with reference to the accompanying drawings, of exemplary embodiments of the surface acoustic wave device in which it is possible to prevent the seal resin portion 20 having a hollow structure from peeling from the piezoelectric substrate 10 and to improve the reliability.

First Exemplary Embodiment

Figure 3A:
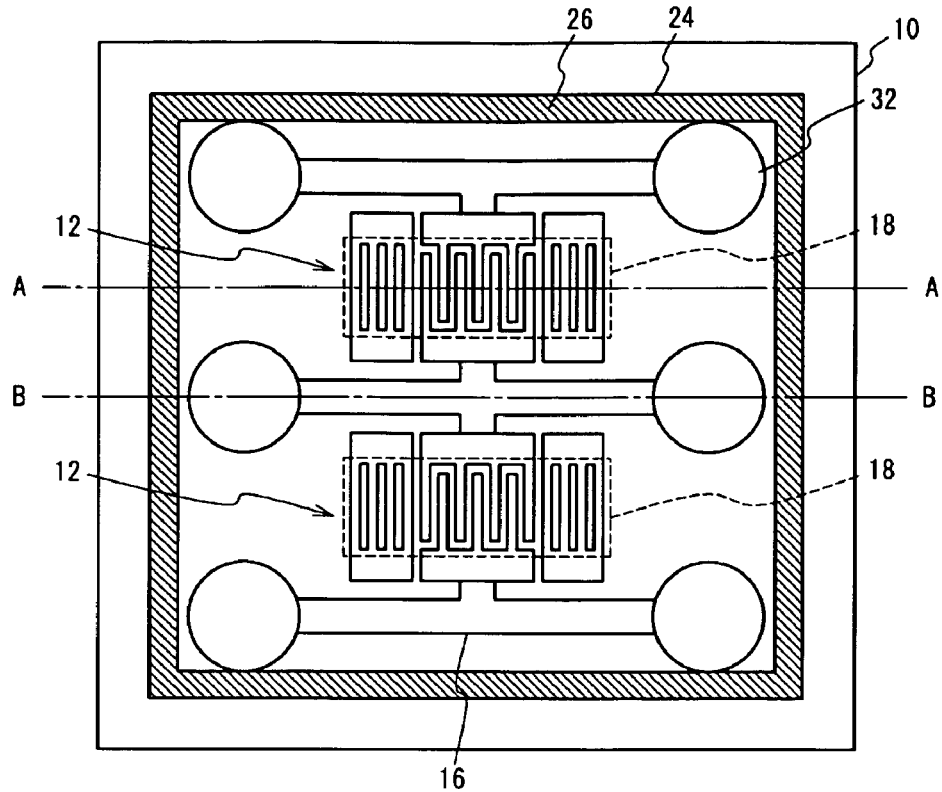
FIG. 3A is a plan view of a surface acoustic wave device in accordance with a first exemplary embodiment of the present invention.
Figure 3B:
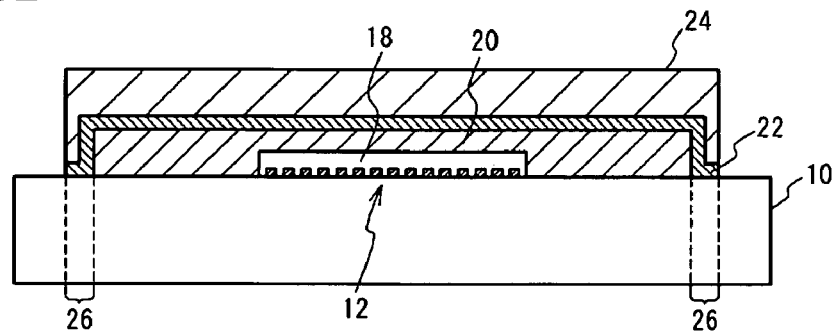
FIG. 3B is a cross-sectional view taken along the line A-A shown in FIG. 3A.
Figure 3C:
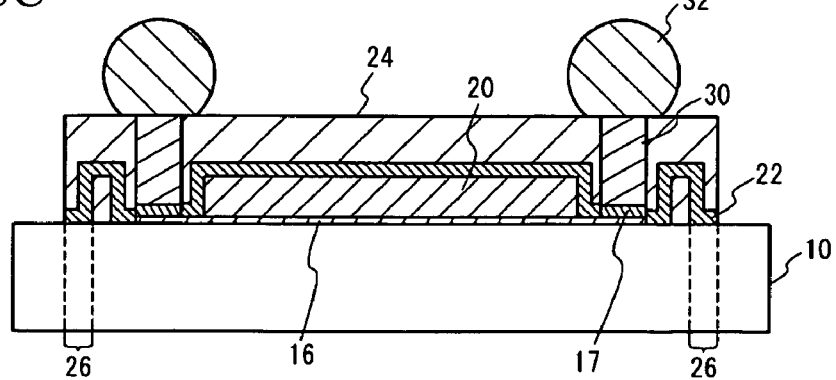
FIG. 3C is a cross-sectional view taken along the line B-B shown in FIG. 3A.

FIG. 3A is a plan view of a surface acoustic wave device in accordance with a first exemplary embodiment of the present invention. FIG. 3B is a cross-sectional view taken along the line A-A shown in FIG. 3A. FIG. 3C is a cross-sectional view taken along the line B-B shown in FIG. 3A. In FIG. 3A, there are shown the surface acoustic wave elements 12, the wiring 16, and the cavities 18, with the first seal resin portion 20 transparent, and the surface acoustic wave elements 12 and the wiring 16 are represented by solid lines and the cavities 18 are represented by dotted lines. Also, a region 26 where an inorganic insulation film 22 and the piezoelectric substrate 10 are in contact is indicated by hatching. Referring to FIG. 3A and FIG. 3B, the surface acoustic wave device includes the surface acoustic wave elements 12 composed of: IDTs formed by using metal films such as Al or the like on the piezoelectric substrate (LiTaO$_3$ or LiNbO$_3$); electrodes such as reflectors or the like; and the piezoelectric substrate 10. The first seal resin portion 20 including an epoxy resin is provided to have the cavities 18 in contact with the functional parts of the surface acoustic wave elements 12. A cavity 18 is provided on each of the two surface acoustic wave elements 12. The inorganic insulation film 22 is provided in the region 26 to cover the first seal resin portion 20 and to be in contact with the piezoelectric substrate 10 at the periphery of the first seal resin portion 20. A silicon oxide film or a silicon nitride film is used for the inorganic insulation film 22. There is also provided on the inorganic insulation film 22, a second seal resin portion 24 that includes an epoxy resin or polyimide resin.

Referring to FIG. 3A and FIG. 3C, the wiring 16 made of a metal film such as Al is provided on the piezoelectric substrate 10. The wiring 16 connects the surface acoustic wave elements 12 and the plug metals 30, described later. The first seal resin portion 20 is provided on the wiring 16 and on the piezoelectric substrate 10. The inorganic insulation film 22 is provided in the periphery of the first seal resin portion 20 and provided to be in contact with the piezoelectric substrate 10 in the periphery of the plug metals 30. The second seal resin portion 24 is provided on the inorganic insulation film 22. The inorganic insulation film 22 is arranged to surround the first seal resin portion 20. In other words, the inorganic insulation film 22 is arranged on the region 26 that surrounds the surface acoustic wave elements 12 on the piezoelectric substrate 10.

A description will now be given of a fabrication method of the surface acoustic wave device employed in the first exemplary embodiment, with reference to FIG. 4A through FIG. 8F. FIG. 4A through FIG. 4C, FIG. 5A and FIG. 5B, FIG. 6A through FIG. 6C, FIG. 7A through FIG. 7C, and FIG. 8A through FIG. 8C are cross-sectional views taken along the line A-A shown in FIG. 3A, illustrating a fabrication method. Meanwhile, FIG. 4D through FIG. 4F, FIG. 5C through FIG. 5D, FIG. 6D through FIG. 6F, FIG. 7D through FIG. 7F, and FIG. 8D through FIG. 8F are cross-sectional views taken along the line B-B shown in FIG. 3A, illustrating the fabrication method. Also, FIG. 4A through FIG. 8F illustrate the fabrication method by using the piezoelectric substrate 10 in a wafer state, and there are multiple regions to be multiple surface acoustic wave devices in the wafer. Hereinafter, a description will be given of a region to be one surface acoustic wave device, whereas the wafer includes multiple regions to be multiple surface acoustic wave devices. Chip separating regions 64 in the drawings are regions for separating the wafer into multiple surface acoustic wave devices by, for example, dicing.

Figure 4A:
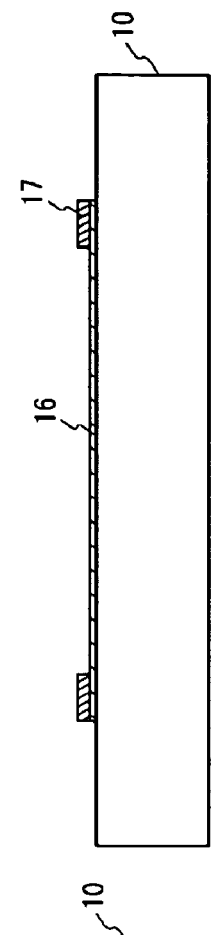
FIGS. 4A through 4F are first cross-sectional views showing a fabrication method of a surface acoustic wave device in accordance with a first exemplary embodiment of the present invention.
Figure 4D:
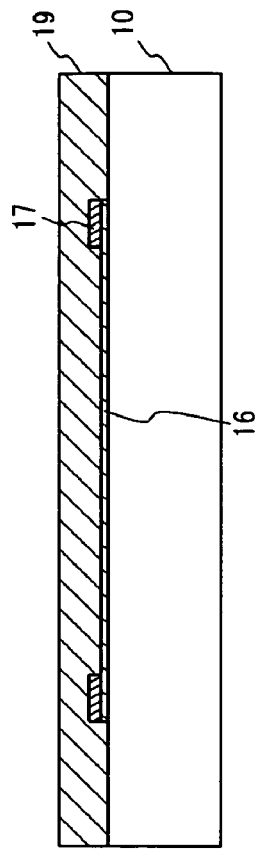
Figure 4B:
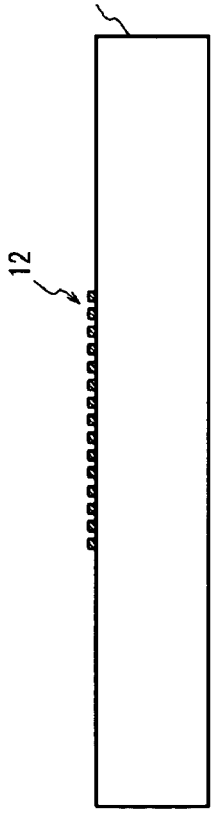
Figure 4E:
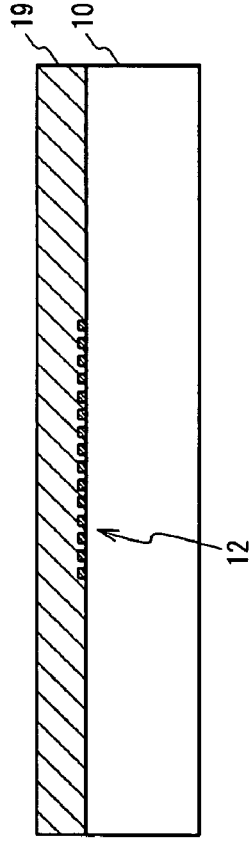
Figure 4C:
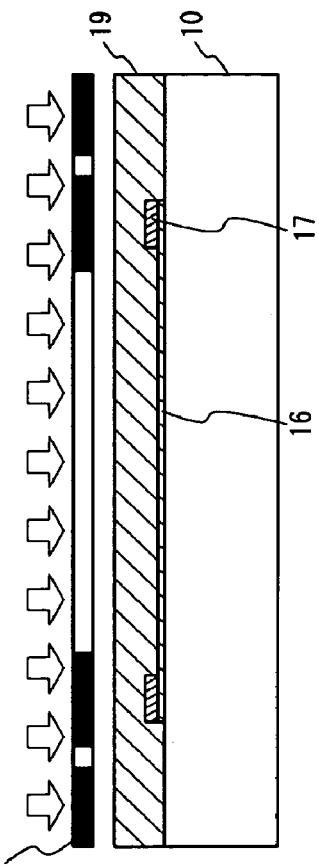
Figure 4F:
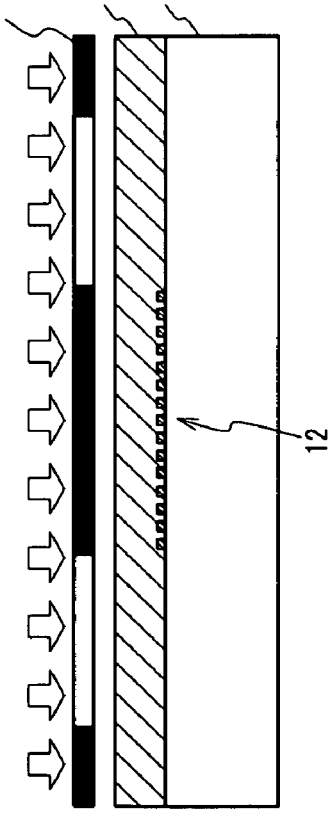

Referring to FIG. 4A through FIG. 4D, metal films are provided by using Al on the piezoelectric substrate 10 (LiTaO$_3$, LiNbO$_3$, or the like) to form the surface acoustic wave elements 12 and the wiring 16. The electrodes 17 are formed in the regions on the wiring 16 in which the plug metals 30 are to be formed. Referring to FIG. 4B and FIG. 4E, approximately 20 μm of an epoxy resin 19 having negative photosensitivity, which exposed portion is not developed, is applied on the piezoelectric substrate 10, on the surface acoustic wave elements 12, and on the wiring 16, and post bake is then performed. Referring to FIG. 4C and FIG. 4F, the photosensitive resin 19 is exposed to ultraviolet radiation (ultraviolet rays) or lights by use of a mask, except for a region where the cavity 18 is to be formed on the functional part of the surface acoustic wave element 12, the region above the electrodes 17, and the region for the chip separating regions 64.

Figure 5A:
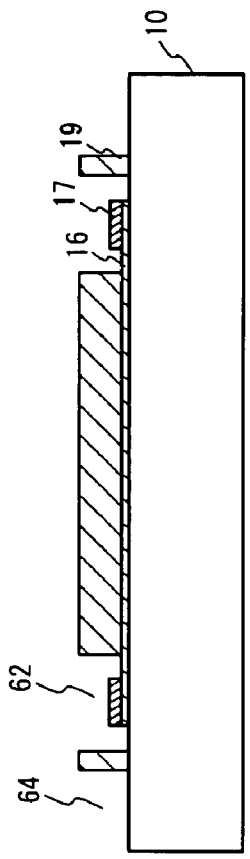
FIGS. 5A through 5D are second cross-sectional views showing the fabrication method of the surface acoustic wave device in accordance with the first exemplary embodiment of the present invention.
Figure 5C:
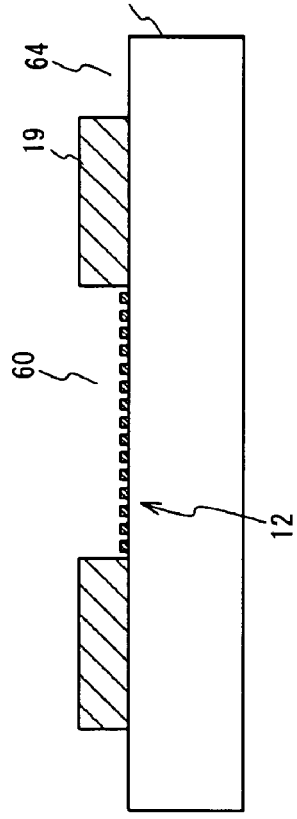
Figure 5B:
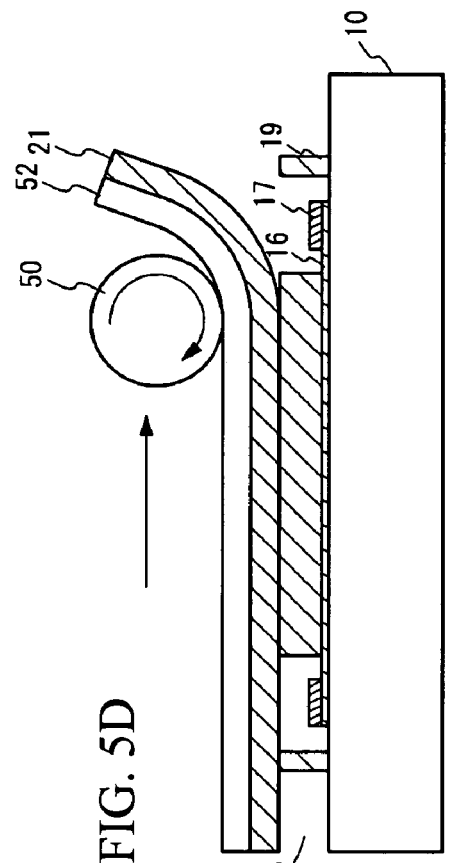
Figure 5D:
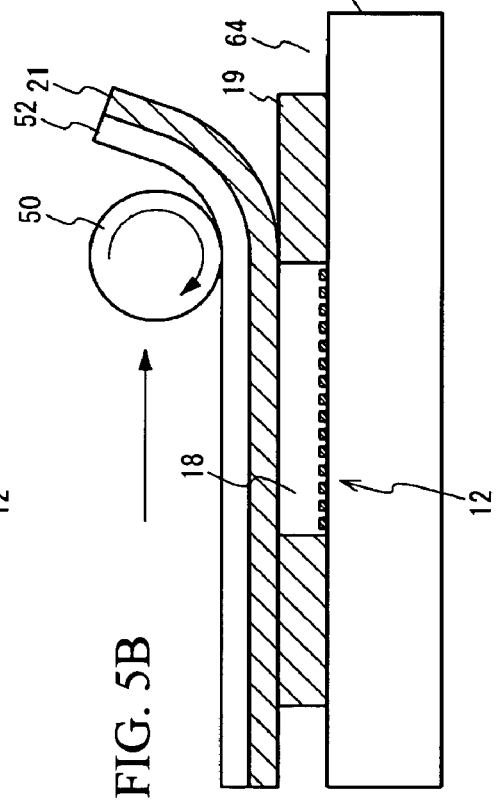

Referring to FIG. 5A and FIG. 5C, the photosensitive resin 19 is developed to remove the photosensitive resin 19 from the regions that are not exposed to the ultraviolet radiation (ultraviolet rays) or lights. This provides an opening 60 to be a cavity in the photosensitive resin 19, openings 62 in the peripheries of the electrodes 17, and openings of the chip separating regions 64. Also, a thermal treatment is done for one hour at 200° C. in nitrogen atmosphere to harden the photosensitive resin 19. Referring to FIG. 5B and FIG. 5D, a film-shaped negative photosensitive resin 21 coated on a protection film 52 is pressed and attached onto the photosensitive resin 19, by using a press roll 50 such as a laminator or the like.

Figure 6A:
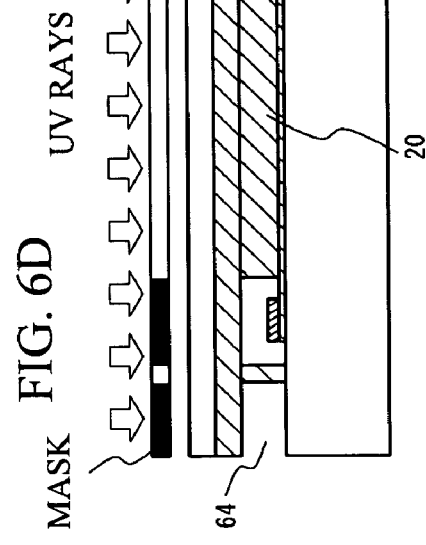
FIGS. 6A through 6F are third cross-sectional views showing the fabrication method of the surface acoustic wave device in accordance with the first exemplary embodiment of the present invention.
Figure 6B:
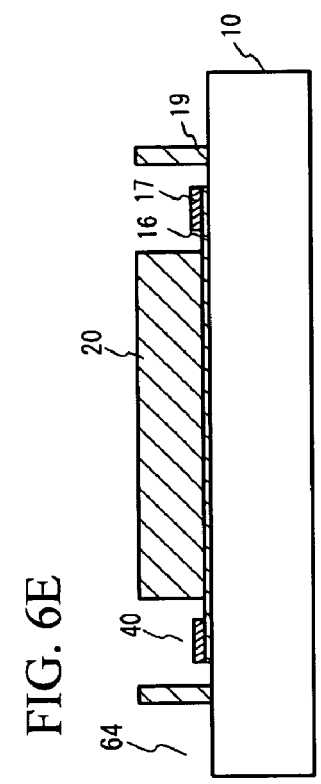
Figure 6C:
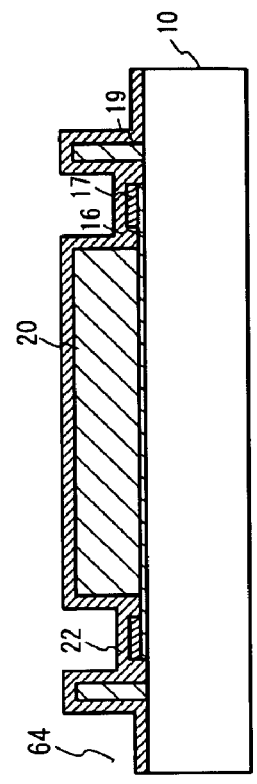
Figure 6D:
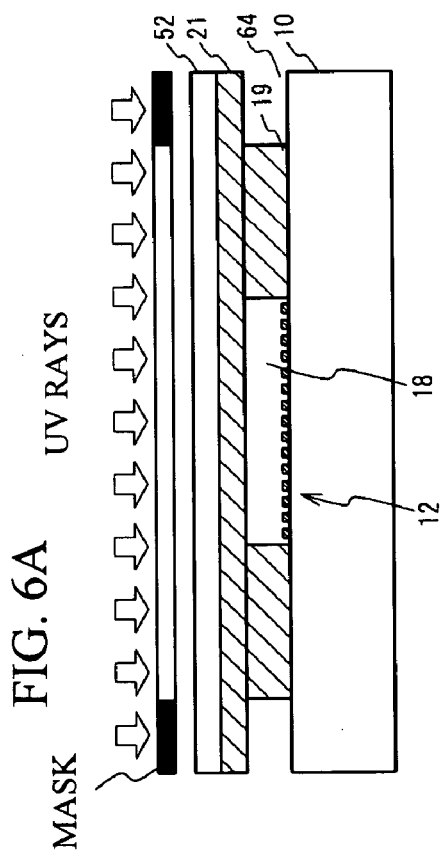
Figure 6E:
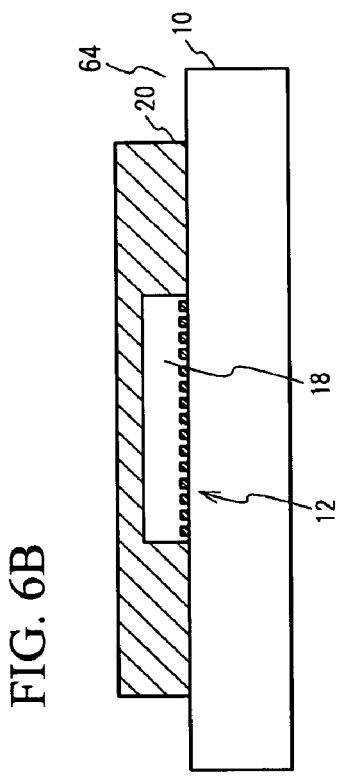
Figure 6F:
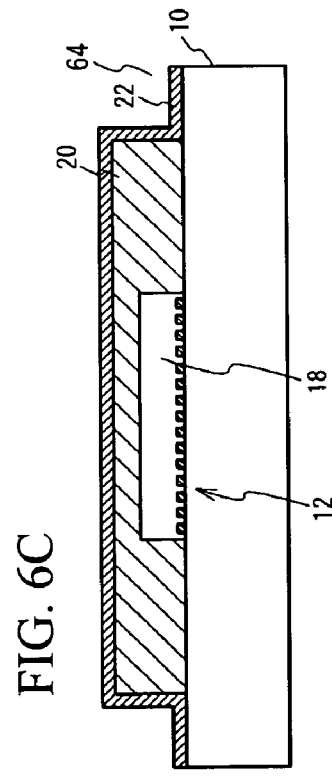

Referring to FIG. 6A and FIG. 6D, the region other than the regions above the electrodes 17 and the chip separating regions 64 is exposed to ultraviolet rays. Referring to FIG. 6B and FIG. 6E, the protection film 52 is removed and the development is performed to remove the photosensitive resin 21 in the region that is not exposed to the ultraviolet rays or lights. Subsequently, the photosensitive resin 21 is hardened by doing the thermal treatment for one hour at 200° C. in nitrogen atmosphere. As stated heretofore, there is provided the first seal resin portion 20 that is composed of the photosensitive resins 19 and 21 and that has the cavity 18 on the surface acoustic wave element 12. At the same time, there are provided: the openings 40 that extend through the first seal resin portion 20 in the peripheries of the regions where the plug metals 30 are to be formed; and the openings in the chip separating regions 64. Referring to FIG. 6C and FIG. 6F, the inorganic insulation film 22 is formed on the first seal resin portion 20, on the region that surrounds the first seal resin portion 20, and on the surface of the piezoelectric substrate 10 in the openings 40. The inorganic insulation film 22 is formed by depositing a silicon oxide film having a thickness of approximately 1 μm by Chemical Vapor Deposition (CVD) with the use of tetraethylortho silicate (TEOS).

Figure 7A:
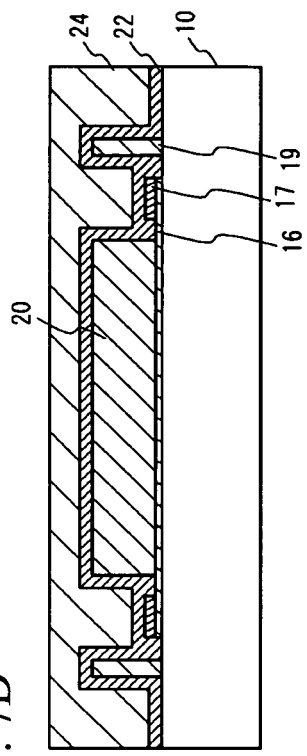
FIGS. 7A through 7F are fourth cross-sectional views showing the fabrication method of the surface acoustic wave device in accordance with the first exemplary embodiment of the present invention.
Figure 7B:
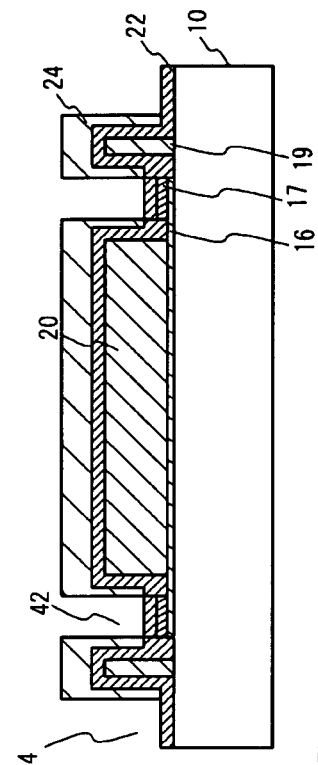
Figure 7C:
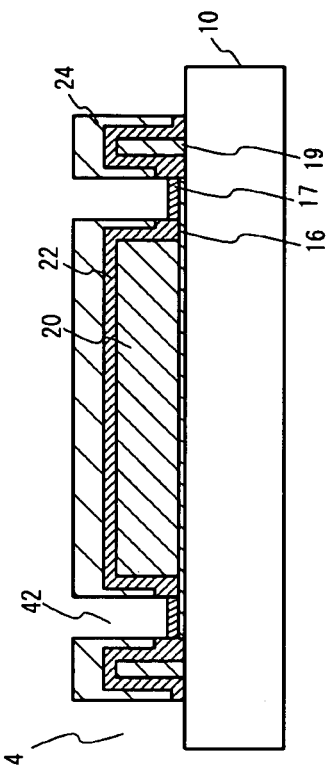
Figure 7D:
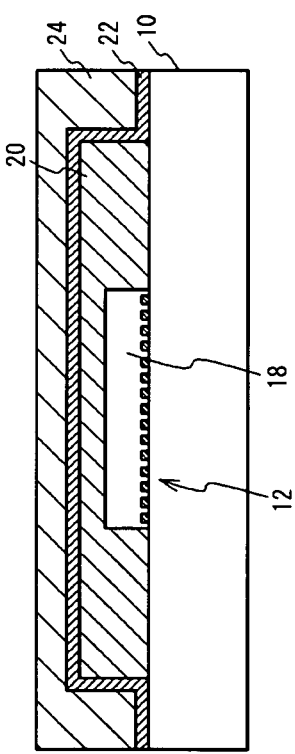
Figure 7E:
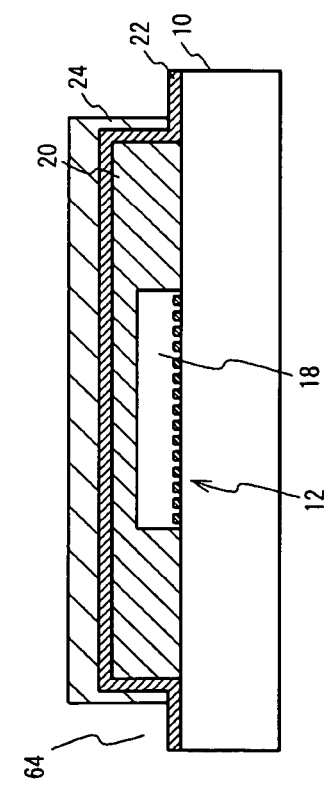
Figure 7F:
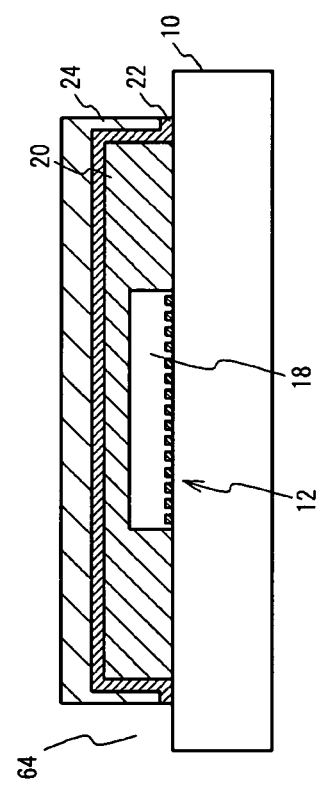

Referring to FIG. 7A and FIG. 7D, approximately 10 μm of the second seal resin portion 24 that includes a negative photosensitive epoxy resin is applied onto the inorganic insulation film 22. Referring to FIG. 7B and FIG. 7E, the exposure to the ultraviolet radiation (ultraviolet rays) or lights is performed to make the second seal resin portion 24 that covers the first seal resin portion 20 remain by use of a mask, and the development is done. The thermal treatment is performed at 200° C. for one hour in nitrogen atmosphere to harden the second seal resin portion 24. This forms the second seal resin portion 24 on the inorganic insulation film 22. At this time, there are formed openings 42 in which the plug metals 30 are to be formed in the second seal resin portion 24, and the openings for the chip separating regions 62. Referring to FIG. 7C and FIG. 7F, the inorganic insulation film 22 is dry etched with a mixed gas of CF$_4$ and oxygen, by using the second seal resin portion 24 as a mask. Hydrofluoric acid solution may be employed for etching the inorganic insulation film 22, when, for example, Au is used for the electrodes 17, instead of Al. This is because Al is etched by hydrofluoric acid, whereas Au is not etched by hydrofluoric acid. During the etch process, the inorganic insulation film 22 is etched away bottoms of the openings 42 and in the chip separating regions 64, and thereby forming the inorganic insulation film 22 to be in contact with the surface of the piezoelectric substrate 10 surrounding the first seal resin portion 20, namely, the surface acoustic wave element 12. There are also provided the openings 42 that extend through the first seal resin portion 20, the second seal resin portion 24, and the inorganic insulation film 22. The second seal resin portion 24 is provided on the inorganic insulation film 22 in this manner.

Figure 8A:
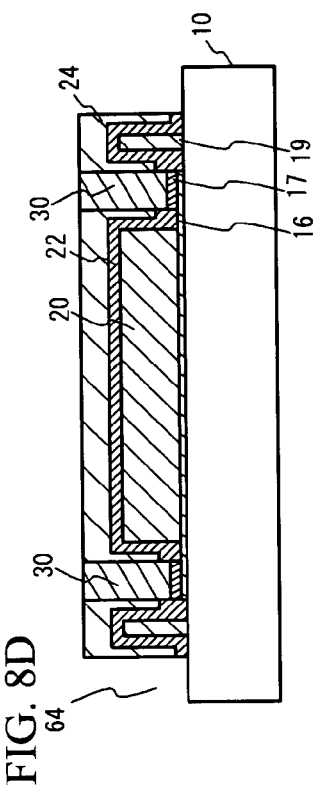
FIGS. 8A through 8F are fifth cross-sectional views showing the fabrication method of the surface acoustic wave device in accordance with the first exemplary embodiment of the present invention.
Figure 8B:
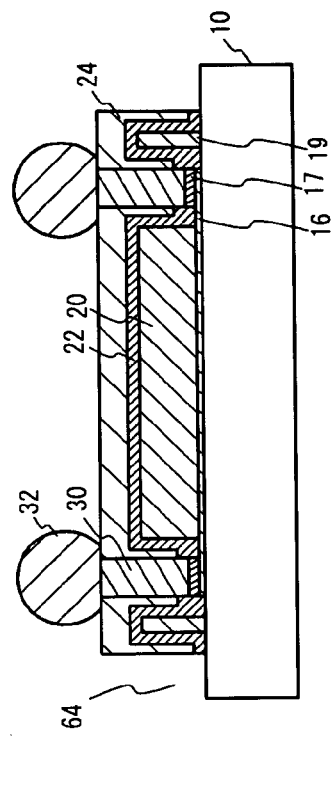
Figure 8C:
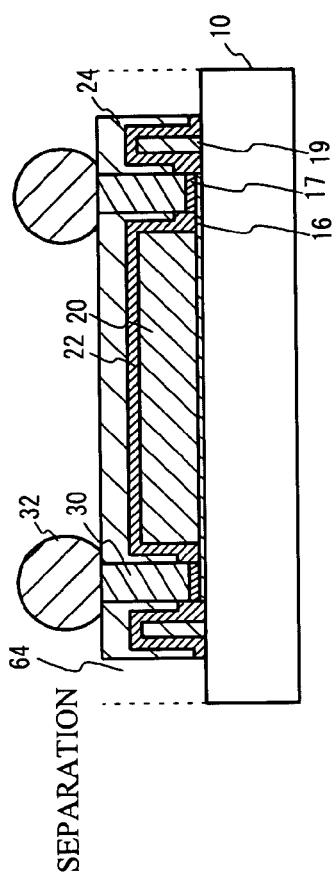
Figure 8D:
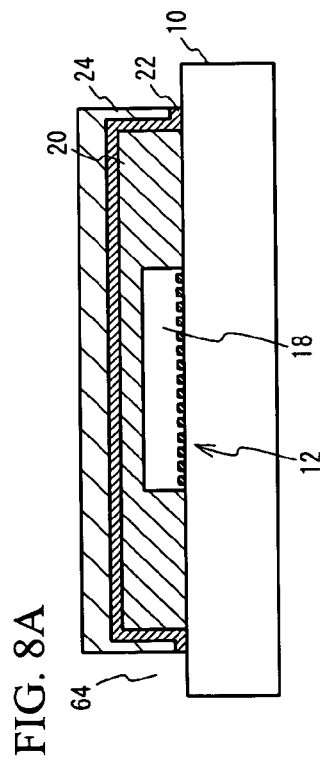
Figure 8E:
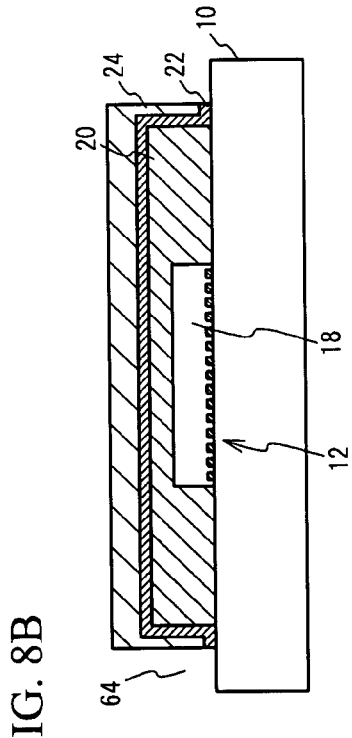
Figure 8F:
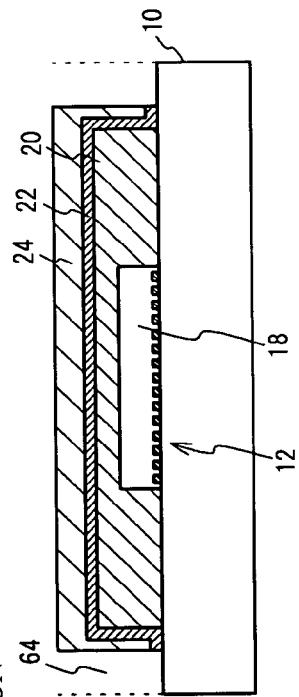

Referring to FIG. 8A and FIG. 8D, Ni, Cu, Au, or the like is metallized or plated by electroless plating or electrolytic plating in the openings 42 to form the conductive plug metals 30. When the electrolytic plating is employed, all the wirings need be connected to each other. The wirings are electrically separated, as the piezoelectric substrate is separated by dicing. Alternatively, the plug metals 30 may be formed by printing a conductive material such as silver paste or the like and filling in the openings 42. Referring to FIG. 8B and FIG. 8E, the solder balls 32 are provided to be in connection with the plug metals 30. As stated, there are provided the plug metals 30 and the solder balls 32 (coupling portion) electrically coupled to the surface acoustic wave element 12. Referring to FIG. 8C and FIG. 8F, the chip separating regions 64 in the piezoelectric substrate 10 are separated by dicing. The surface acoustic wave device is thus completed.

The surface acoustic wave device employed in the first exemplary embodiment includes the inorganic insulation film 22 that is in contact with the surface of the piezoelectric substrate 10 and that wholly surrounds the surface acoustic wave elements 12 as the region 26. This enables a strong bonding between the piezoelectric substrate 10 and the inorganic insulation film 22, and thereby making it possible to prevent the first seal resin portion 20 or the second seal resin portion 24 from peeling during PCT, unlike the comparative example.

In addition, the inorganic insulation film 22 is provided to cover the first seal resin portion 20. The inorganic insulation film 22 has the lower moisture-absorption characteristic and the lower moisture permeability than resins. It is therefore possible to prevent the first seal resin portion 20 from absorbing moisture. This can prevent the first seal resin portion 20 from swelling, and thereby preventing the first seal resin portion 20 or the second seal resin portion 24 from peeling during PCT, unlike the comparative example.

Furthermore, the second seal resin portion 24 is arranged on the inorganic insulation film 22. This can protect the inorganic insulation film 22. It is also possible to form the plug metals 30 and the solder balls 32 with ease. By employing an epoxy resin for the first seal resin portion 20 and a polyimide resin for the second seal resin portion 24, the second seal resin portion 24 may be removed by use of hydrazine or the like, subsequent to the formation of the solder balls 32 in FIG. 8B and FIG. 8E. In FIG. 7A and FIG. 7D, a resist may be used instead of the resin, and in FIG. 8B and FIG. 8E, the resist may be removed. When the second seal resin portion 24 is not provided, the height of the seal resin portion can be decreased, and thereby the height of the surface acoustic wave device can be decreased.

There are also provided the plug metals 30 and the solder balls (coupling portion) electrically coupled to the surface acoustic wave element 12. The plug metals 30 (coupling portion) are provided to extend through the inorganic insulation film 22 and the second seal resin portion 24. Surface mounting is available in this manner by providing the coupling portion electrically coupled through the inorganic insulation film 22 and the second seal resin portion 24 to the surface of the surface acoustic wave element 12. The plug metals 30 (coupling portion) are provided to extend through the first seal resin portion 20.

A film including silicon oxide or silicon nitride may be employed for the inorganic insulation film 22. It is possible to improve the bonding characteristic between the piezoelectric substrate 10 and the inorganic insulation film 22 by use of the silicon oxide film or the silicon nitride film. The coverage is improved by employing the silicon oxide film. The moisture-absorption characteristic can be improved by employing the silicon nitride film more than the silicon oxide film, whereas the silicon nitride film has a lower coverage than the silicon oxide film. The inorganic insulation film 22 may be deposited by CVD. This makes it possible to deposit the inorganic insulation film 22 having an excellent bonding characteristic with the piezoelectric substrate 10. According to the first exemplary embodiment, the silicon oxide film is deposited by TEOS-CVD, thereby providing the inorganic insulation film 22 having an excellent coverage. The silicon nitride film having a low moisture-absorption characteristic can be provided by depositing the silicon nitride film by CVD.

A resin including an epoxy resin or a polyimide resin may be employed for the first seal resin portion 20 and the second seal resin portion 24. By including the above-described resin, the seal resin portion of a hollow structure can be formed with ease. Generally, the epoxy resin is lower in moisture absorption and lower in heat resistance than the polyimide resin. Which resin should be employed may be decided in consideration of the afore-described characteristics.

In FIG. 7C and FIG. 7F, the inorganic insulation film 22 is removed from the chip separating regions 64 on the piezoelectric substrate 10. In FIG. 8C and FIG. 8F, the piezoelectric substrate 10 is separated at the chip separating regions 64. In most cases, the piezoelectric substrate 10 is separated by dicing. Water is used in the dicing process, and moisture is easily absorbed in the seal resin portion. As in the first exemplary embodiment, the inorganic insulation film 22 formed prior to the dicing process makes it possible to prevent the first seal resin portion 20 from absorbing moisture.

Second Exemplary Embodiment

Figure 9A:
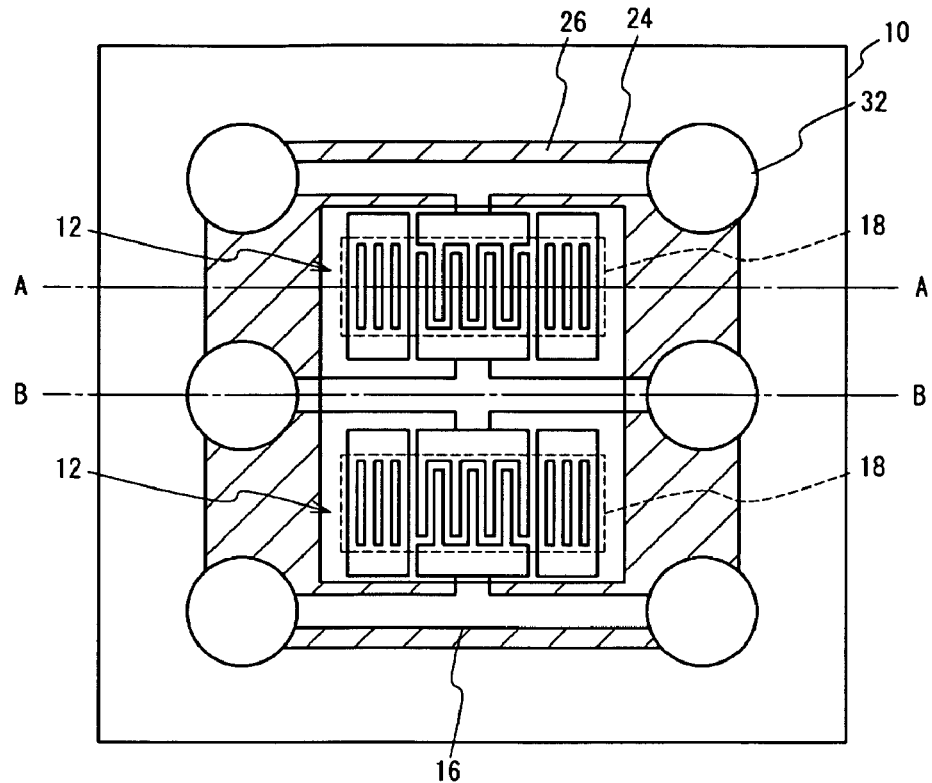
FIG. 9A is a plan view of a surface acoustic wave device in accordance with a second exemplary embodiment of the present invention.
Figure 9B:
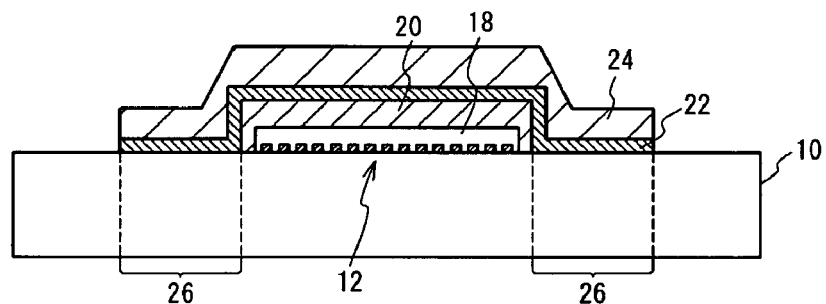
FIG. 9B is a cross-sectional view taken along the line A-A shown in FIG. 9A.
Figure 9C:
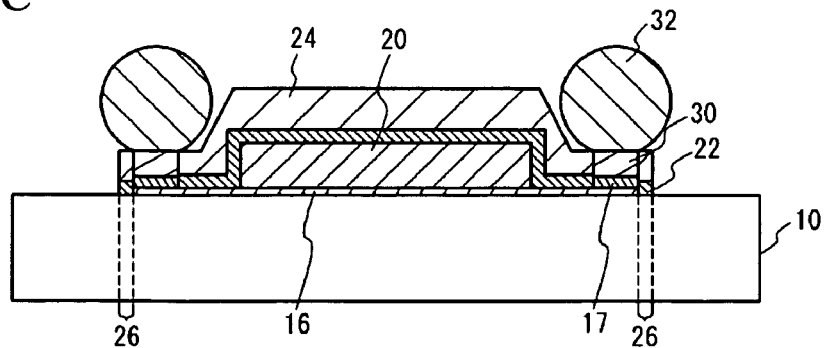
FIG. 9C is a cross-sectional view taken along the line B-B shown in FIG. 9A.

FIG. 9A is a plan view of a surface acoustic wave device in accordance with a second exemplary embodiment of the present invention. FIG. 9B is a cross-sectional view taken along the line A-A shown in FIG. 9A. FIG. 9C is a cross-sectional view taken along the line B-B shown in FIG. 9A. As compared to FIG. 3A through FIG. 3C, the first seal resin portion 20 is formed in the periphery of the cavity 18, and the plug metals 30 do not extend through the first seal resin portion 20. In FIG. 9A through FIG. 9C, other configurations are same as those shown in FIG. 3A through FIG. 3C, the same components and configurations as those employed in FIG. 3A through FIG. 3C have the same reference numerals, and a detailed explanation will be omitted.

Referring now to FIG. 10A through FIG. 11F, a description will be given of a fabrication method of the surface acoustic wave device employed in the second exemplary embodiment of the present invention. FIG. 10A through FIG. 10C and FIG. 11A through FIG. 11C are cross-sectional views taken along the line A-A shown in FIG. 9A, illustrating a fabrication method. Meanwhile, FIG. 10D through FIG. 10F and FIG. 11D through FIG. 11F are cross-sectional views taken along the line B-B shown in FIG. 9A, illustrating the fabrication method.

Figure 10A:
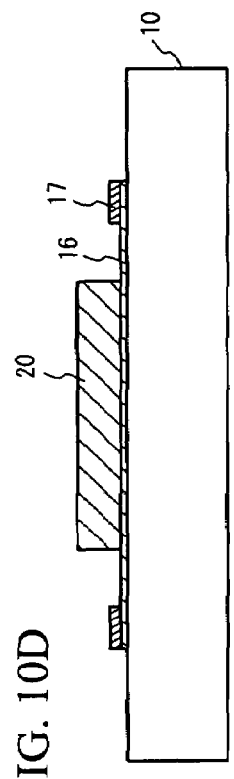
FIGS. 10A through 10F are first cross-sectional views showing a fabrication method of a surface acoustic wave device in accordance with a second exemplary embodiment of the present invention.
Figure 10B:
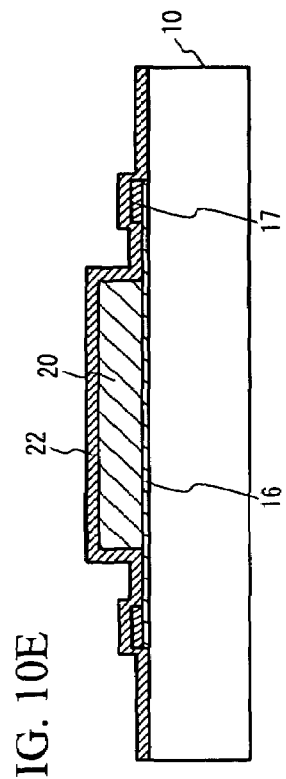
Figure 10C:
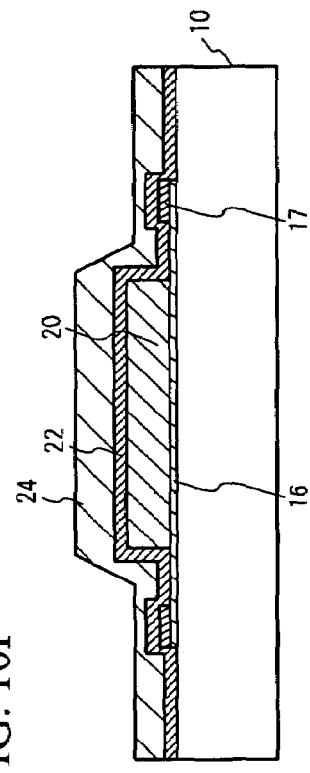
Figure 10D:
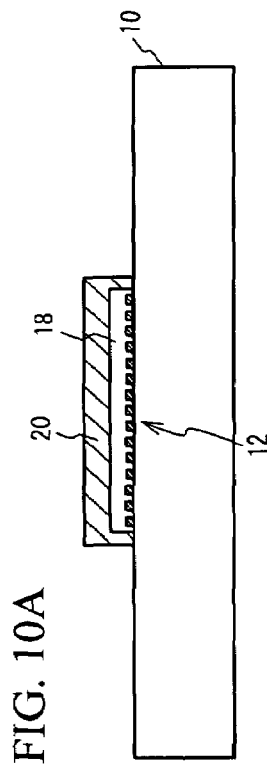
Figure 10E:
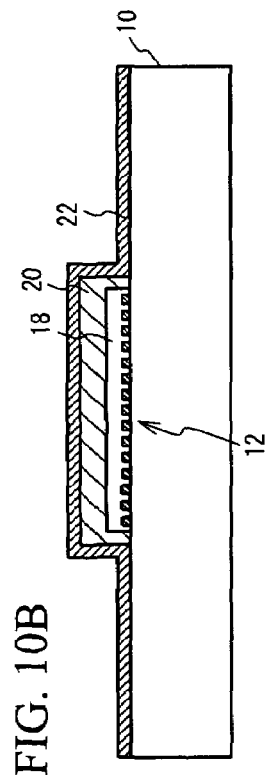
Figure 10F:
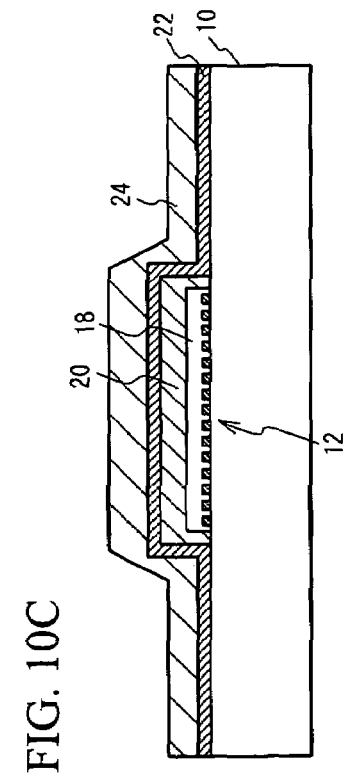
Figure 11A:
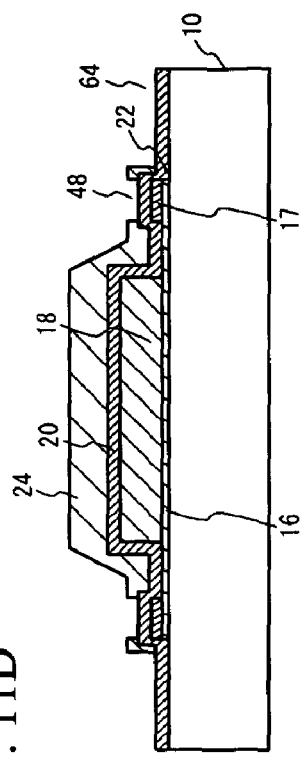
FIGS. 11A through 11F are second cross-sectional views showing the fabrication method of the surface acoustic wave device in accordance with the second exemplary embodiment of the present invention.
Figure 11B:
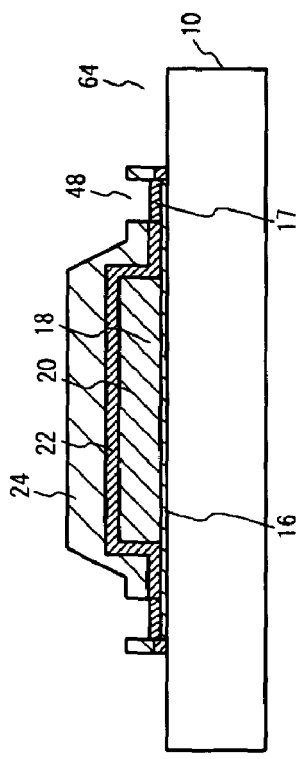

Referring to FIG. 10A and FIG. 10D, the first seal resin portion 20 is formed on the piezoelectric substrate 10, in a similar manner as shown in FIG. 4A through FIG. 4F, FIG. 5A through FIG. 5D, FIG. 6A, FIG. 6B, FIG. 6D, and FIG. 6E. The first seal resin portion 20 has the cavities 18 in contact with the functional parts of the surface acoustic wave elements 12. Referring to FIG. 10B and FIG. 10E, the inorganic insulation film 22 is provided on the first seal resin portion 20 and in the region on the surface of the piezoelectric substrate 1, the region surrounding the first seal resin portion 20. Referring to FIG. 10C and FIG. 10F, approximately 10 μm of the second seal resin portion 24 is applied on the inorganic insulation film 22, in a similar manner as in the first exemplary embodiment. Referring to FIG. 11A and FIG. 11D, the openings 48 in which the plug metals 30 are to be formed and the second seal resin portion 24 in the openings of the chip separating regions 64 are removed in a similar manner as in the first exemplary embodiment. Referring to FIG. 11B and FIG. 11E, the inorganic insulation film 22 is etched away by using the second seal resin portion 24 as a mask. Then, the inorganic insulation film 22 is formed to be in contact with the surface of the piezoelectric substrate 10 and surround the first seal resin portion 20, namely, the surface acoustic wave element 12. The openings 48 are also formed to extend through the second seal resin portion 24 and the inorganic insulation film 22.

Figure 11C:
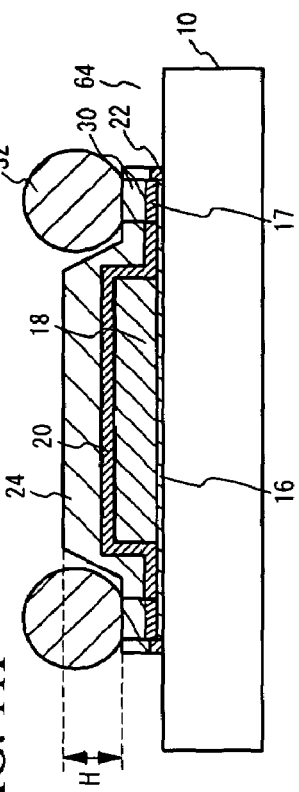
Figure 11D:
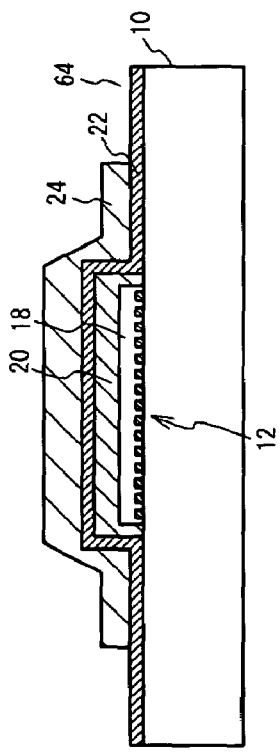
Figure 11E:
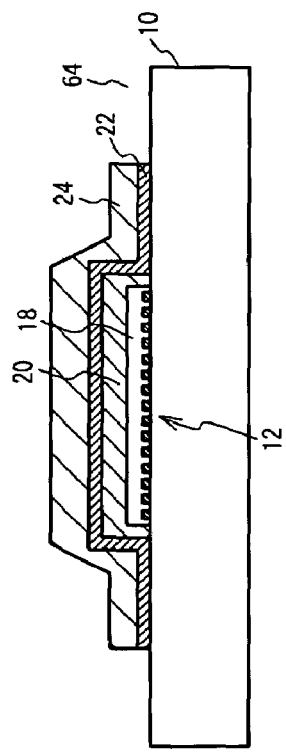
Figure 11F:
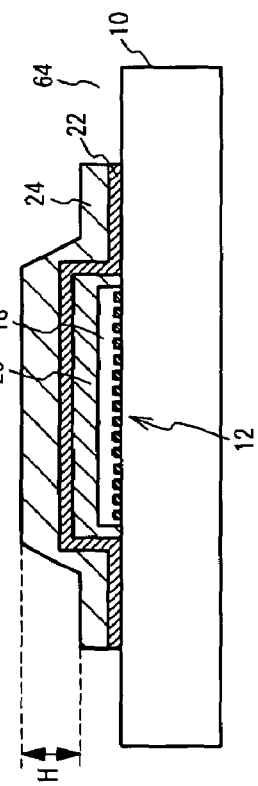

Referring to FIG. 11C and FIG. 11F, the plug metals 30 are provided in the openings 48. The solder balls 32 are provided on the plug metals 30 to be in connection with the plug metals 30. The chip separating regions 64 in the piezoelectric substrate 10 are separated by dicing. As described heretofore, the surface acoustic wave device employed in the second exemplary embodiment is completed.

In accordance with the second exemplary embodiment, the first seal resin portion 20 is not provided in the peripheries of the plug metals 30 or the solder balls 32. Therefore, the top surface of the second seal resin portion 24 in connection with the plug metals 30 and the solder balls 32 (coupling portion) is lower by a height H than the top surface of the second seal resin portion 24 above the surface acoustic wave element 12, as shown in FIG. 11C and FIG. 11F. It is therefore possible to reduce the height of the surface acoustic wave device employed in the second exemplary embodiment, as compared to that employed in the first exemplary embodiment. In the second exemplary embodiment, it is possible to make the height of the top surface of the second seal resin portion 24 above the surface acoustic wave element 12 from the piezoelectric substrate 10 approximately 50 µm, whereas it is possible to make the top surface of the second seal resin portion 24 in connection with the plug metals 30 and the solder balls 32 (coupling portion) from the piezoelectric substrate 10 approximately 30 µm.

In the first and second exemplary embodiments, there are provided two surface acoustic wave elements 12 and the two cavities 18. However, the present invention is not limited to the above-described numbers, and one or more surface acoustic wave elements may be provided. In addition, the description has been given of the plug metals 30 and the solder balls 32 as the coupling portions. However, any coupling portion that has a function of electrically coupling the surface acoustic wave element 12 to the outside may be employed. Furthermore, the description has been given of the silicon oxide film or the silicon nitride film employed for the inorganic insulation film 22. However, the inorganic insulation film 22 is not limited thereto, and any film that has a strong adhesion with the piezoelectric substrate 10 may be employed. For example, an oxy-nitride silicon film or an aluminum oxide film may be employed. The description has been given of the epoxy resin or the polyimide resin employed for the first seal resin portion 20 and the second seal resin portion 24. However, the present invention is not limited thereto. Any resin that protects the surface acoustic wave element 12 may be employed.

Finally, various aspects of the present invention are summarized in the following.

According to one aspect of the present invention, there is provided a surface acoustic wave device including: a piezoelectric substrate; a surface acoustic wave element composed of electrodes provided on the piezoelectric substrate and the piezoelectric substrate; a first seal resin portion provided on the piezoelectric substrate and having a cavity on the surface acoustic wave element; and an inorganic insulation film provided in contact with a surface of the piezoelectric substrate to surround the surface acoustic wave element.

In the above-described surface acoustic wave device, the inorganic insulation film may be provided to cover the first seal resin portion. It is possible to prevent the first seal resin portion form absorbing moisture, and thereby further improving the reliability.

The above-described surface acoustic wave device may further include a second seal resin portion provided on the inorganic insulation film. The second seal resin portion can protect the inorganic insulation film.

The above-described surface acoustic wave device may further include a coupling portion electrically coupled to the surface acoustic wave element, the coupling portion being provided to extend through the inorganic insulation film and the second seal resin portion. The coupling portion enables surface mounting.

In the above-described surface acoustic wave device, the coupling portion may be provided to extend through the first seal resin portion.

In the above-described surface acoustic wave device, a top surface of the second seal resin portion in connection with the coupling portion may be lower than the top surface of the second seal resin portion above the surface acoustic wave element. It is possible to reduce the height of the surface acoustic wave device.

In the above-described surface acoustic wave device, the inorganic insulation film may include at least one of silicon oxide and silicon nitride. It is possible to improve the bonding between the piezoelectric substrate and the inorganic insulation film.

In the above-described surface acoustic wave device, the first seal resin portion and the second seal resin portion may include at least one of an epoxy resin and a polyimide resin. It is possible to provide the seal resin portion of a hollow structure with ease.

According to another aspect of the present invention, there is provided a fabrication method of a surface acoustic wave device including: forming a surface acoustic wave element on a piezoelectric substrate; forming a first seal resin portion on the piezoelectric substrate to have a cavity on the surface acoustic wave element; and forming an inorganic insulation film on the first seal resin portion and on a surface of the piezoelectric substrate that surrounds the first seal resin portion.

The above-described method may further include forming a second seal resin portion on the inorganic insulation film. The second seal resin portion can protect the inorganic insulation film.

The above-described method may further include: forming openings that extend through the inorganic insulation film and the first seal resin portion; and forming a coupling portion electrically coupled to the surface acoustic wave element in the openings. The coupling portion enables surface mounting.

In the above-described fabrication method, forming the inorganic insulation film may include at least one of forming a silicon oxide film by TEOS-CVD and forming a silicon nitride film by CVD. It is possible to improve the bonding between the piezoelectric substrate and the inorganic insulation film.

In the above-described fabrication method, forming the first seal resin portion includes: forming a photosensitive resin layer on the piezoelectric substrate; and forming the cavity by exposing the photosensitive resin layer to lights. It is possible to form a cavity in the seal resin portion with ease.

The above-described fabrication method may further include separating the piezoelectric substrate at chip separating regions. The inorganic insulation film can prevent the first seal resin portion from absorbing moisture during the dicing process.

The present invention is based on Japanese Patent Application No. 2005-290969 filed on Oct. 4, 2005, the entire disclosure of which is hereby incorporated by reference.

What is claimed is:

1. An acoustic wave device comprising:
   an acoustic wave element formed on a substrate and composed of provided on the substrate;
   a first seal resin portion provided on the substrate and having a cavity on the acoustic wave element;
   an inorganic insulation film provided on the first seal resin portion and in contact with a surface of the substrate to surround the first seal resin portion;
   a second seal resin portion provided on the inorganic insulation film; and
   a coupling portion being electrically coupled to the acoustic wave element, the coupling portion being provided in openings penetrating through the inorganic insulation film and the first and second seal resin portions.

2. The acoustic wave device as claimed in claim 1, wherein the inorganic insulation film is provided to cover the first seal resin portion.

3. The acoustic wave device as claimed in claim 1, wherein the inorganic insulation film includes at least one of silicon oxide and silicon nitride.

4. The acoustic wave device as claimed in claim 1, wherein the first seal resin portion and the second seal resin portion include at least one of an epoxy resin and a polyimide resin.

5. An acoustic wave device, comprising:
   an acoustic wave element formed on a substrate and composed of electrodes provided on the substrate;
   a first seal resin portion provided on the substrate and having a cavity on the acoustic wave element; and
   an inorganic insulation film provided in contact with a surface of the substrate to surround the acoustic wave element,
   wherein a top surface of a second seal resin portion in connection with a coupling portion is lower than the top surface of the second seal resin portion above the acoustic wave element.

6. A fabrication method of an acoustic wave device comprising:
   forming an acoustic wave element on a substrate;
   forming a first seal resin portion on the substrate to have a cavity on the acoustic wave element;
   forming an inorganic insulation film on the first seal resin portion and in contact with a surface of the substrate that surrounds the first seal resin portion;
   forming a second seal resin portion on the inorganic insulation film;
   forming openings that penetrate through the inorganic insulation film and the first and second seal resin portions; and
   forming a coupling portion electrically coupled to the acoustic wave element in the openings.

7. The fabrication method as claimed in claim 6, wherein forming the inorganic insulation film includes at least one of forming a silicon oxide film by TEOS-CVD and forming a silicon nitride film by CVD.

8. The fabrication method as claimed in claim 6, wherein forming the first seal resin portion includes:
   forming a photosensitive resin layer on the substrate; and
   forming the cavity by exposing the photosensitive resin layer to lights.

9. The fabrication method as claimed in claim 6, further comprising separating the substrate at chip separating regions.

* * * * *